(12) United States Patent
Chaivipas

(10) Patent No.: US 9,077,593 B2
(45) Date of Patent: Jul. 7, 2015

(54) RECEIVER CIRCUIT AND METHOD FOR CONTROLLING RECEIVER CIRCUIT

(71) Applicant: FUJITSU LIMITED, Kawasaki-shi, Kanagawa (JP)

(72) Inventor: Win Chaivipas, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/149,388

(22) Filed: Jan. 7, 2014

(65) Prior Publication Data
US 2014/0286457 A1  Sep. 25, 2014

(30) Foreign Application Priority Data
Mar. 22, 2013  (JP) .................................. 2013-060634

(51) Int. Cl.
*H04B 1/10*  (2006.01)
*H04L 27/22*  (2006.01)
(52) U.S. Cl.
CPC ...................................... *H04L 27/22* (2013.01)
(58) Field of Classification Search
CPC ........................................................ H04L 27/22
USPC ................................................. 375/350, 329
See application file for complete search history.

(56) References Cited

U.S. PATENT DOCUMENTS

| 5,247,544 | A  | * | 9/1993 | LaRosa et al. | 375/371 |
| 7,042,252 | B2 | * | 5/2006 | Galloway et al. | 327/16 |
| 7,292,662 | B2 | * | 11/2007 | Gregorius | 375/350 |
| 7,715,509 | B2 | * | 5/2010 | Stojanovic et al. | 375/355 |
| 8,074,126 | B1 | * | 12/2011 | Qian et al. | 714/704 |
| 8,238,503 | B2 | * | 8/2012 | Noguchi | 375/371 |
| 2006/0062341 | A1 | * | 3/2006 | Edmondson et al. | 375/376 |
| 2007/0160173 | A1 | | 7/2007 | Takeuchi | |
| 2008/0063127 | A1 | | 3/2008 | Hayashi et al. | |
| 2009/0224809 | A1 | | 9/2009 | Matsumoto et al. | |

FOREIGN PATENT DOCUMENTS

| JP | 2007-184847 | 7/2007 |
| JP | 2008-072319 | 3/2008 |
| JP | 2009-212992 | 9/2009 |

* cited by examiner

*Primary Examiner* — Juan A Torres
(74) *Attorney, Agent, or Firm* — Fujitsu Patent Center

(57) ABSTRACT

A receiver circuit includes: a data interpolation switched capacitor circuit which samples a data signal and outputs a voltage value interpolated from a sampled voltage value in correspondence with an interpolation code indicating an interpolation ratio; a comparator which performs comparison between the voltage value outputted from the data interpolation switched capacitor circuit and a threshold value; a phase detection circuit which detects a boundary based on an output of the comparator and decides whether to advance or delay a phase; and an interpolation code generation circuit which generates an interpolation code corresponding to an output of the phase detection circuit, wherein a phase offset related to sampling is imparted and an offset corresponding to an amount of the phase offset is imparted to the threshold value of the comparator.

8 Claims, 14 Drawing Sheets

F I G. 1
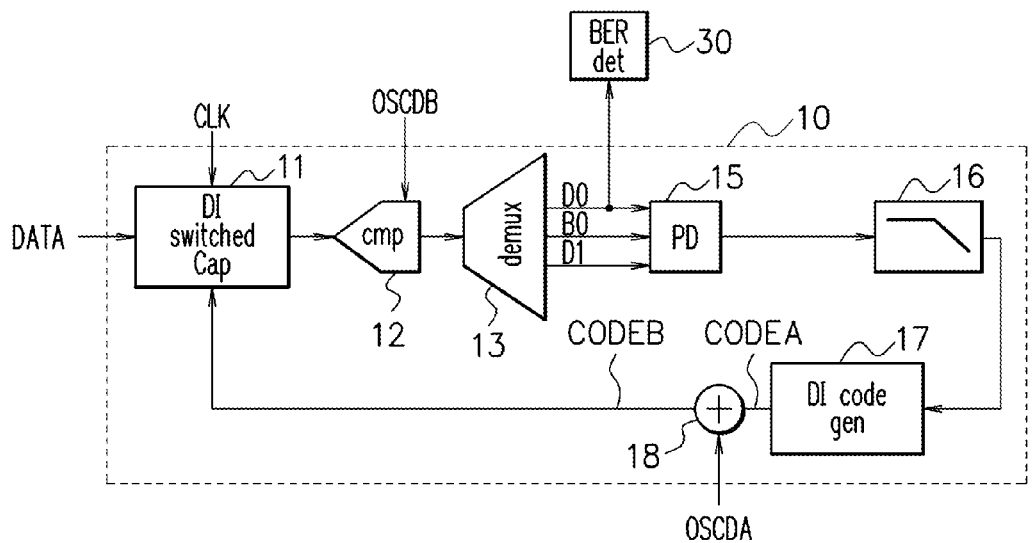
F I G. 2A
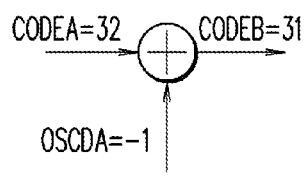
F I G. 2B
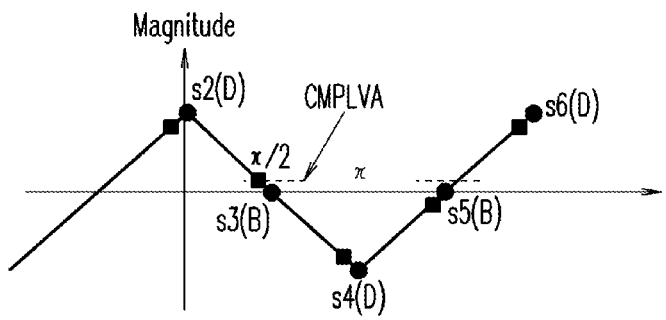

F I G. 5
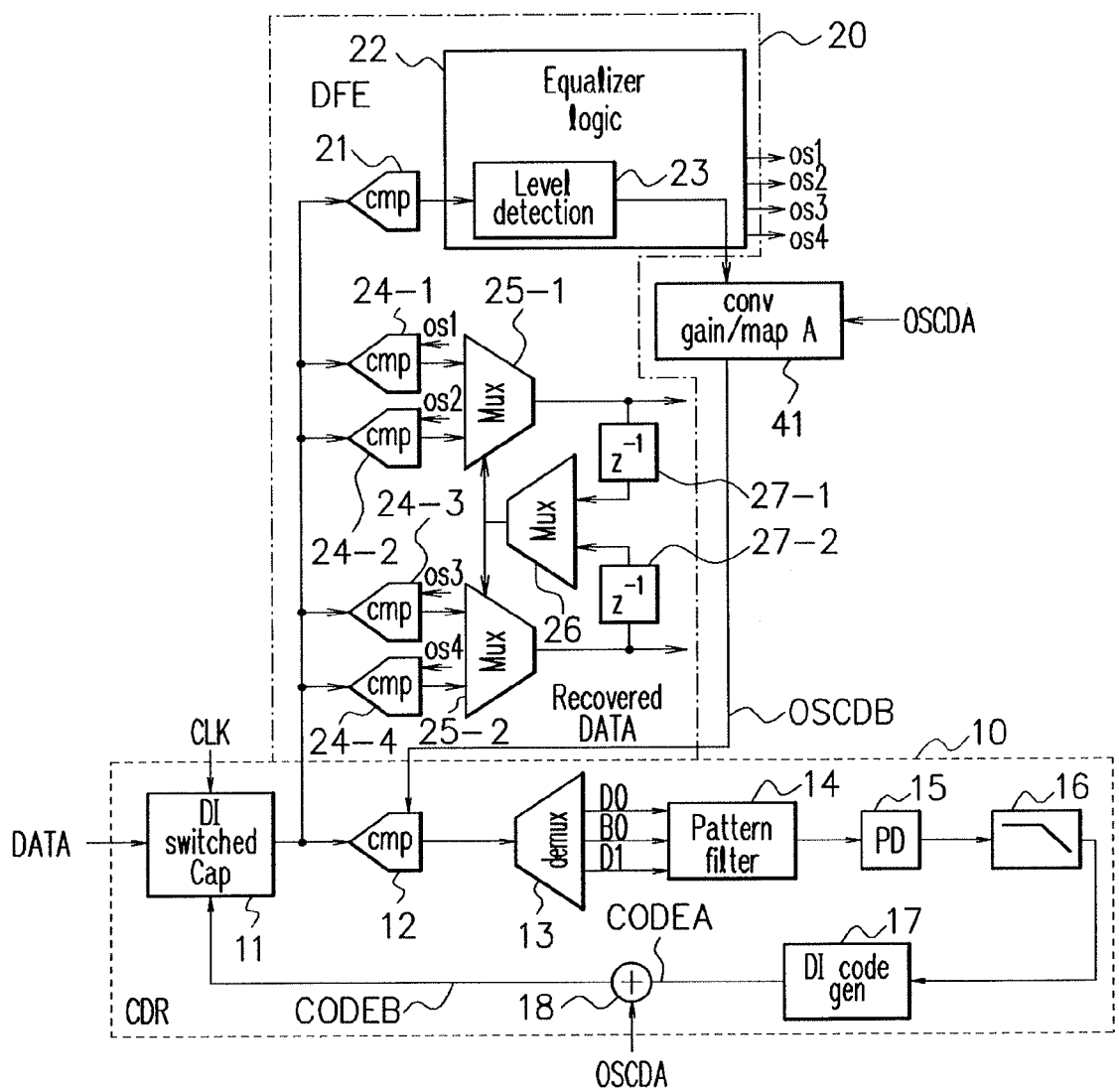

F I G. 6
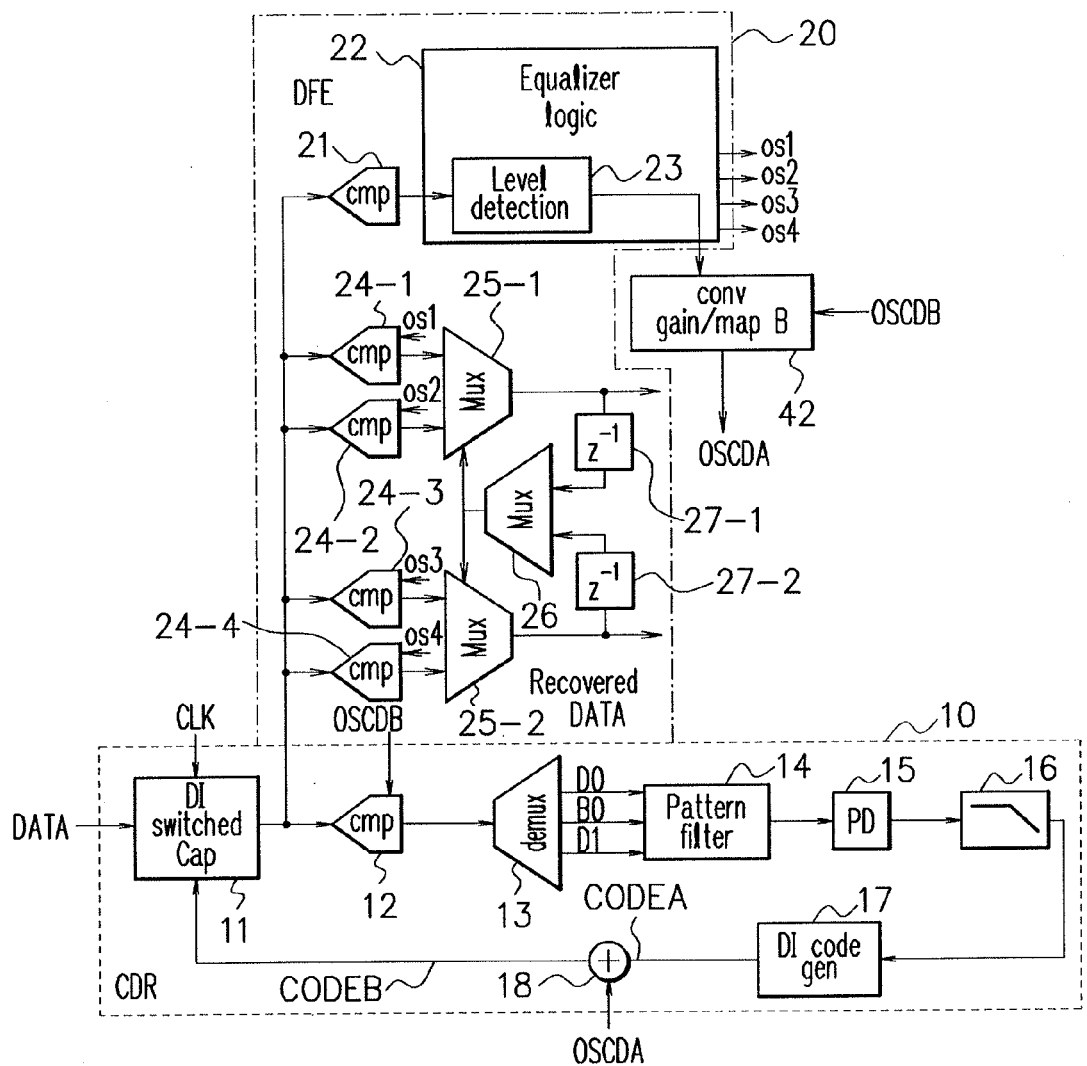

F I G. 7A
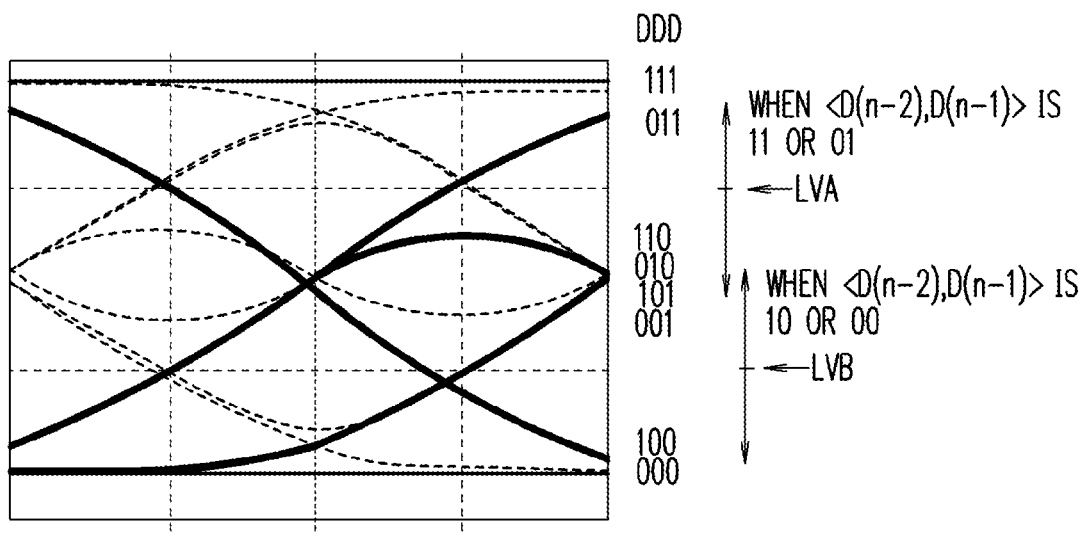
F I G. 7B
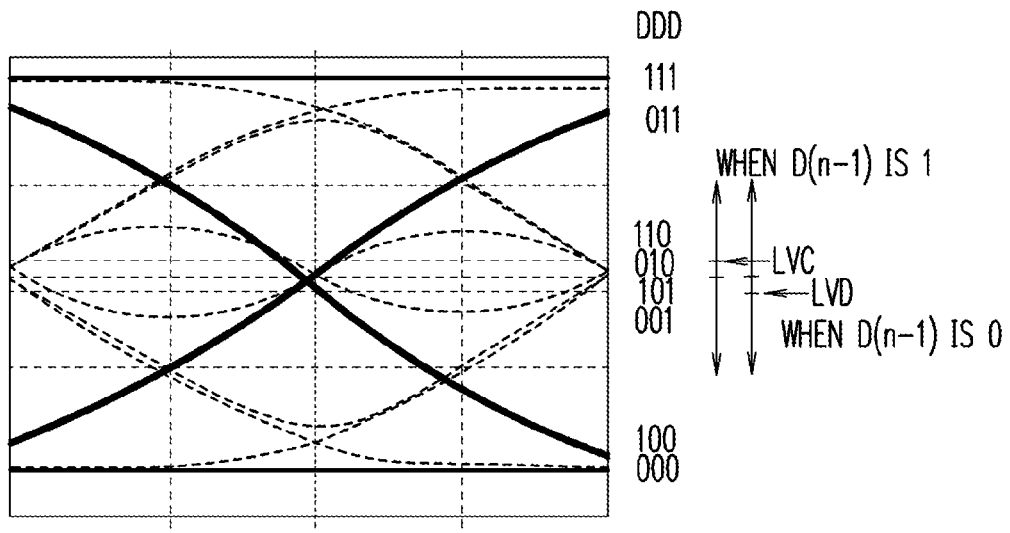

F I G. 10
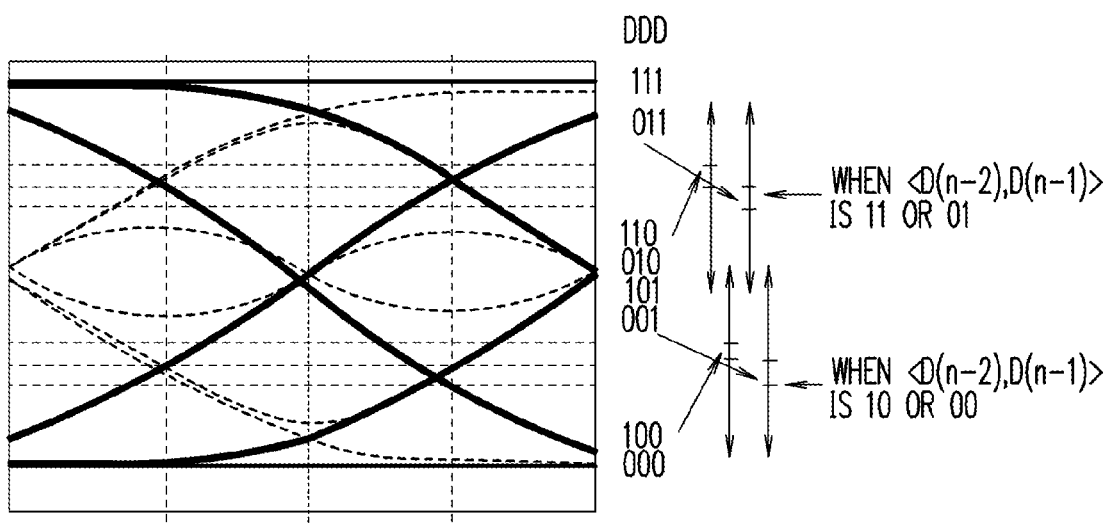

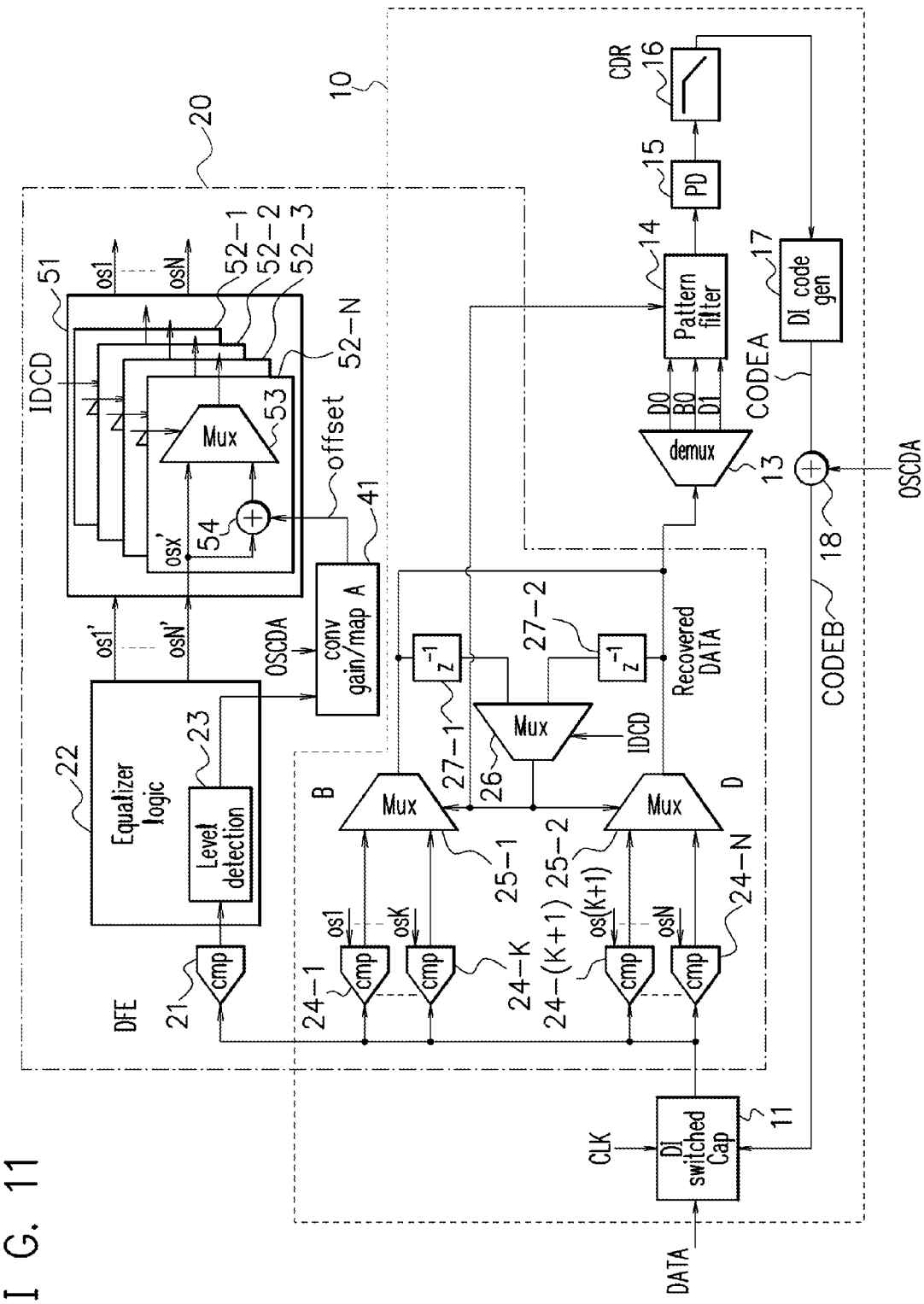
F I G. 11

1 unit interval (UI)

RECEIVER CIRCUIT AND METHOD FOR CONTROLLING RECEIVER CIRCUIT

CROSS-REFERENCE TO RELATED APPLICATION

This application is based upon and claims the benefit of priority of the prior Japanese Patent Application No. 2013-060634, filed on Mar. 22, 2013, the entire contents of which are incorporated herein by reference.

FIELD

The embodiments discussed herein are directed to a receiver circuit using a clock and data recovery (CDR) circuit and a method for controlling the receiver circuit.

BACKGROUND

With improvement of performance of information processing apparatus or the like, data rate of signals transferred within the apparatus or between the apparatuses becomes high, and a clock and data recovery (CDR) circuit which reproduces a clock and data from a received data signal is used in the communication circuit of a receiving side. In order to evaluate the quality of a product when such a communication circuit is made into a product, a test related to a bit error rate (BER) is performed. A test technique related to the bit error rate includes, for example, a bath tub test in which the detection phase of data is swept while the CDR circuit is kept in a locked state and the bit error rate at each detection phase and amplitude of data is obtained, an eye-monitor.

For example, in a receive data signal depicted in FIG. 13A, transition timing of data changes randomly in actual communication by jitter, noise in the time axis, and by noise in the voltage axis and so on, as depicted in FIG. 13B. It is possible to evaluate the operating margin by an eye diagram obtained by sweeping the phase of the data in a state where a boundary is kept constant as depicted in FIG. 13C. For example, it is possible to obtain a permissible amount of displacement of a detection phase of the data from the optimum sampling point. In FIG. 13C, the lateral direction indicates a detection phase of data in 1 UI (unit interval), the vertical direction indicates the threshold voltage of data decision, and a region "eye" indicates a region in which data may be detected with accuracy. As stated above, as a result of obtaining the bit error rate in each phase by sweeping the detection phase of the data, it is possible to check whether or not the present detection phase of data is optimum, or how much margin a sample time has.

There exists a CDR circuit in which the existence of an error in the sampled data is detected by changing a phase of an extraction clock outputted from a phase interpolator or a threshold value level of a sampling circuit, so that operation margin in time and voltage is measured (for example, see Patent Document 1). There exists a semiconductor device in which an eye-opening margin of the receive data, which includes a jitter component of a CDR circuit, is evaluated in a receiver circuit of high-speed serial data of a parallel clock system (for example, see Patent Document 2). There exists a technique in which the phase of a clock signal is adjusted based on a phase adjustment signal for adjusting the detection timing of data, to which an offset is added, and the detection timing of data is displaced in time in correspondence with the offset, to perform a jitter tolerance test (for example, see Patent Document 3).

[Patent Document 1] Japanese Laid-open Patent Publication No. 2007-184847

[Patent Document 2] Japanese Laid-open Patent Publication No. 2009-212992

[Patent Document 3] Japanese Laid-open Patent Publication No. 2008-72319

Configuration examples of CDR circuits are depicted in FIG. 14A and FIG. 14B, the CDR circuit has a function to allow for sweeping of the detection phase of the data in a state where the boundary is kept constant, to realize a bath tub test or eye-monitor. FIG. 14A depicts an example of a phase-interpolation-type CDR circuit. In FIG. 14A, reference number 202 indicates a phase detection circuit, reference number 203 indicates a low-pass filter, reference number 204 indicates an interpolation code generation circuit, reference numbers 205 and 206 indicate phase interpolation circuits, reference number 207 indicates an adder, reference number 208 indicates a sampling circuit, reference number 209 indicates a bit error rate detection circuit, and reference number 210 indicates a transmission path. FIG. 14B depicts an example of a data-interpolation-type CDR circuit. In FIG. 14B, reference numbers 212 and 219 indicate data interpolation switched capacitor circuits, reference numbers 213 and 220 indicate comparators, reference number 214 indicates a demultiplexer, reference number 215 indicates a phase detection circuit, reference number 216 indicates a low-pass filter, reference number 217 indicates an interpolation code generation circuit, reference number 218 indicates an adder, reference number 221 indicates a bit error rate detection circuit, and reference number 222 indicates a transmission path.

Usually, in order to realize a bath tub test or eye-monitor, two circuits related to interpolation are used in either of the phase-interpolation-type CDR circuit or the data-interpolation-type CDR circuit, as indicated in FIG. 14A and FIG. 14B. Since a general phase-interpolation-type CDR circuit 201 originally uses two phase-interpolation circuits 205, 206 for loop and data sampling, the number of circuits which must be added for realizing a bath tub test or eye-monitor is small. However, it is difficult to produce the phase-interpolation-type CDR circuit such as one depicted in FIG. 14A to cope with a wide frequency range. In contrast, it is not difficult to produce the data-interpolation-type CDR circuit such as one depicted in FIG. 14B to cope with a wide frequency range. However, since the general data-interpolation-type CDR circuit 211 usually uses one data interpolation switched capacitor circuit 212, one more data interpolation switched capacitor circuit 219 must be added in order to realize a bath tub test or eye-monitor. Since a data interpolation switched capacitor circuit has a large circuit area, a circuit area of a CDR circuit is increased and a cost is increased.

SUMMARY

According to an aspect of the embodiment, a receiver circuit includes: a sampling circuit which samples a data signal and outputs a voltage value or a current value interpolated from a voltage value or a current value which have been sampled in correspondence with an interpolation code indicating an interpolation ratio; a comparator which performs comparison between the voltage value or the current value output from the sampling circuit and a threshold value; a phase detection circuit which detects a transition point of the data signal based on the output of the comparator and decides whether to advance or delay a phase; an interpolation code generation circuit which generates an interpolation code corresponding to an output of the phase detection circuit; and an adder which outputs an interpolation code to which a phase offset code indicating a phase offset amount related to sampling of the data signal is added to the sampling circuit, wherein an offset corresponding to the phase offset amount is imparted to the threshold value of the comparator.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 is a diagram depicting a configuration example of a receiver circuit in a present embodiment;

FIGS. 2A and 2B are diagrams for explaining operation examples of the receiver circuit in this embodiment;

FIG. 5 is a diagram depicting a configuration example of a receiver circuit in a first embodiment;

FIG. 6 is a diagram depicting another configuration example of the receiver circuit in the first embodiment;

FIGS. 7A and 7B are diagrams depicting eye diagrams of a decision feedback equalizer of 1 tap;

FIG. 10 is a diagram depicting an eye diagram of a decision feedback equalizer of 2 taps;

FIG. 11 is a diagram depicting another configuration example of the receiver circuit in the second embodiment;

DESCRIPTION OF EMBODIMENTS

Hereinafter, embodiments will be explained with reference to the drawings.

As stated above, making a data-interpolation-type CDR circuit have a function of sweeping a detection phase of data in a state where a boundary is kept constant to realize a bath tub test or eye-monitor means addition of a data-interpolation switched capacitor circuit. However, instead of by moving a boundary and a detection phase of data separately, by moving the boundary and the detection phase of data together in a state where the CDR circuit is locked, that is, by locking the CDR circuit at an offset phase, such a function is available without adding a data interpolation switched capacitor circuit.

Figure 15A:
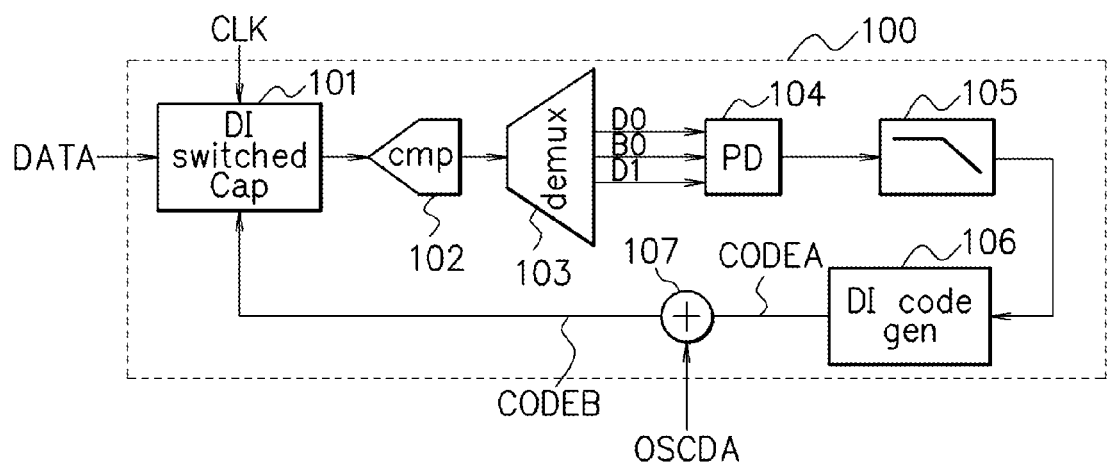
FIG. 15A is a diagram depicting a reference example of a data-interpolation-type CDR circuit.
Figure 15B:
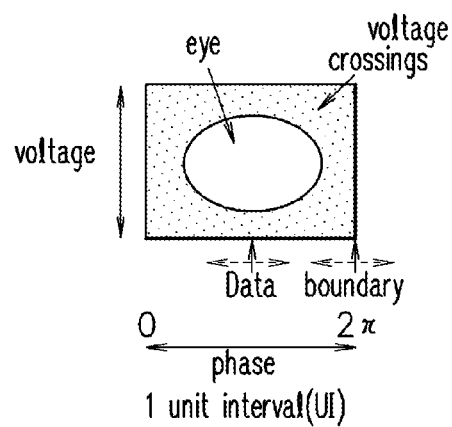
FIG. 15B is a diagram for explaining control of a boundary and a detection phase of data.

FIG. 15A is a diagram depicting a configuration of a data-interpolation-type CDR circuit 100 as a reference example. In FIG. 15A, reference number 101 indicates a data interpolation switched capacitor circuit, reference number 102 indicates a comparator, reference number 103 indicates a demultiplexer, reference number 104 indicates a phase detection circuit, reference number 105 indicates a low-pass filter, reference number 106 indicates an interpolation code generation circuit, and reference number 107 indicates an adder. The data-interpolation-type CDR circuit 100 depicted in FIG. 15A includes the adder 107 between the interpolation code generation circuit 106 and the data interpolation switched capacitor circuit 101 which a general data-interpolation-type CDR circuit includes. A phase offset code OSCDA is added by the adder 107 to an interpolation code CODEA which the interpolation code generation circuit 106 has generated, to generate an interpolation code CODEB, and supply to the data interpolation switched capacitor circuit 101. The interpolation code indicates an interpolation ratio in data interpolation. In the data-interpolation-type CDR circuit 100 depicted in FIG. 15A, by changing the phase offset code OSCDA, it is possible to move a boundary and a detection phase of data together as depicted in FIG. 15B and to sweep the detection phase of the data.

Figure 16A:
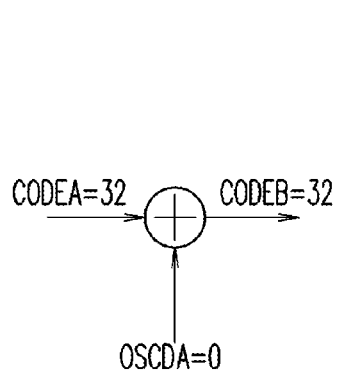
FIGS. 16A and 16B are diagrams for explaining operation examples of the data-interpolation-type CDR circuit depicted in FIG. 15A.
Figure 16B:
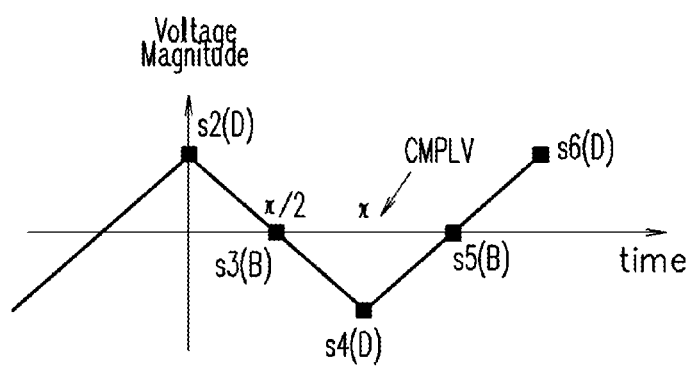

For example, it is assumed that an interpolation code at a time that the data-interpolation-type CDR circuit 100 is in a locked state is "32", in a normal operation (phase offset code OSCDA is "0" (zero)), as depicted in FIG. 16A and FIG. 16B. In FIG. 16B, reference symbols s2(D), s4(D), s6(D) indicate data to be sampled, and reference symbols s3(B), s5(B) indicate boundaries to be sampled (the same applies in FIG. 17B and FIG. 17D). Further, a reference symbol CMPLV indicates a threshold value level (threshold voltage) of the comparator 102. When the data-interpolation-type CDR circuit 100 is in a locked state in a normal operation, sampled voltages (●) and interpolated voltages (■) corresponding to interpolation codes are the same, respectively, for data s2(D), s4(D), s6(D) and boundaries s3(B), s5(B).

Figure 17A:
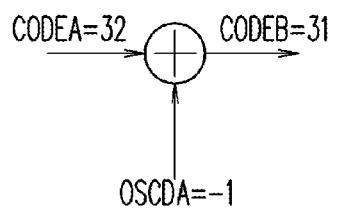
FIGS. 17A, 17B, 17C and 17D are diagrams for explaining operation examples of the data-interpolation-type CDR circuit depicted in FIG. 15A.
Figure 17B:
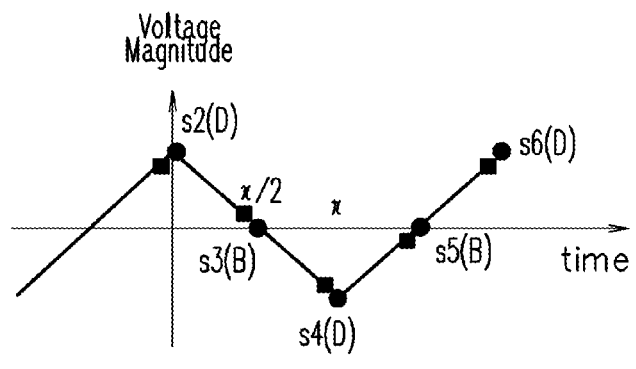
Figure 17C:
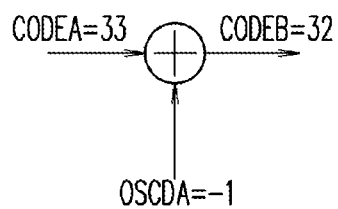
Figure 17D:
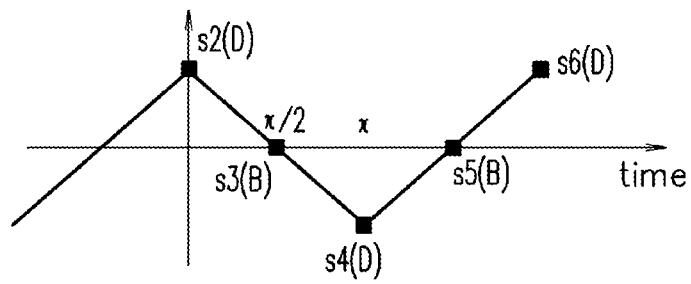

In the data-interpolation-type CDR circuit 100, when the phase offset code OSCDA is "−1", the interpolation code CODEB supplied to the data interpolation switched capacitor circuit 101 becomes "31" as depicted in FIG. 17A. Thereby, the boundary and the detection phase of data are offset as depicted in FIG. 17B. However, since a phase error of the boundary is detected if the phase offset code OSCDA is merely added to the interpolation code CODEA indicating the interpolation ratio, the CDR circuit detects an offset phase by a loop when time passes, and changes the interpolation code CODEA. As a result, the interpolation code CODEB supplied to the data interpolation switched capacitor circuit 101 becomes the same as that at a time of the locked state in the normal operation. For example, when the phase offset code OSCDA is "−1", the interpolation code CODEA generated by the interpolation code generation circuit 106 changes to "33" and interpolation code CODEB supplied to the data interpolation switched capacitor circuit 101 becomes "32" as depicted in FIG. 17C. Therefore, offsets for the boundary and the detection phase of data are lost as depicted in FIG. 17D.

In the present embodiment, the boundary and the detection phase of data are offset by the phase offset code OSCDA. Further, a threshold value (decision point) for detecting the boundary in the comparator is offset by a threshold value offset code OSCDB. Thereby, voltage change corresponding to the phase offset of the boundary is negated and detection of a phase error is prevented, so that a loop of the CDR circuit does not detect the offset phase, enabling the CDR circuit to be locked in the offset phase. Therefore, in the data-interpolation-type CDR circuit, a function of a bath tub test or eye-monitor may be realized while increase of a circuit area being minimized, and it becomes possible to measure a permissible amount of displacement for a detection phase of data.

FIG. 1 is a diagram depicting a configuration example of a receiver circuit in the present embodiment. The receiver circuit in the present embodiment includes a data-interpolation-type CDR circuit 10 and a bit error rate (BER) detection circuit 30. The data-interpolation-type CDR circuit 10 includes a data interpolation switched capacitor circuit 11, a comparator 12, a demultiplexer 13, a phase detection circuit 15, a low-pass filter 16, an interpolation code generation circuit 17, and an adder 18.

The data interpolation switched capacitor circuit 11 as an example of a sampling circuit is a switched capacitor circuit to which a receive data signal DATA and a clock signal CLK are inputted and in which the receive data signal DATA is integrated and sampled by the clock signal CLK. The data-interpolation switched capacitor circuit 11 outputs a voltage value obtained by interpolating a sampled voltage value with an interpolation ratio indicated by the interpolation code CODEB, in correspondence with the inputted interpolation code CODEB. The comparator 12 performs comparison between an output of the data interpolation switched capacitor circuit 11 and a threshold value, and converts the output of the data interpolation switched capacitor circuit 11 into a digital signal and outputs the digital signal. The threshold value (decision point) of the comparator 12 is changeable, and the threshold value (decision point) is controlled by the inputted threshold value offset code OSCDB.

The demultiplexer 13 converts the output of the comparator 12 into parallel data D0, B0, D1, and outputs the parallel data D0, B0, D1 to the phase detection circuit 15. The data D0 outputted from the demultiplexer 13 is supplied to the bit error rate detection circuit 30. The phase detection circuit 15 detects a boundary (transition point of data signal) from a relation of three pieces of inputted data D0, B0, D1, decides whether to advance or delay the phase, and outputs a decision result. The interpolation code generation circuit 17 generates an interpolation code CODEA based on an output of the phase detection circuit 15 inputted via the low-pass filter 16 and outputs the interpolation code CODEA. The adder 18 generates an interpolation code CODEB by adding the phase offset code OSCDA and the interpolation code CODEA generated by the interpolation code generation circuit 17, and outputs the interpolation code CODEB to the data interpolation switched capacitor circuit 11. The phase offset code OSCDA is an offset code for offsetting the boundary and the detection phase of data.

The bit error rate detection circuit 30 compares a data pattern to be inputted as a receive data signal DATA and the data D0 outputted from the demultiplexer 13 to perform detection of the existence of a data error or calculation of a bit error rate. At a time of a test of bit error rate calculation or the like, data such as a pseudo random bit sequence (PRBS), for example, is used as the receive data signal DATA.

For example, it is assumed that an interpolation code at a time that the data-interpolation-type CDR circuit 10 is in a locked state is "32", in a normal operation (phase offset code OSCDA is "0" (zero)). In the data-interpolation type CDR circuit 10, when the phase offset code OSCDA is made to be "−1", the interpolation code CODEB to be supplied to the data interpolation switched capacitor circuit 11 becomes "31" as depicted in FIG. 2A. Thereby, as depicted in FIG. 2B, the boundary and the detection phase of data are offset. In the present embodiment, the threshold value offset code OSCDB corresponding to the phase offset code OSCDA is supplied to the comparator 12, and a threshold value (decision point) CMPLVA of boundary decision in the comparator 12 is changed in correspondence with an amount of the phase offset, as depicted in FIG. 2B. In other words, an offset in an amplitude direction corresponding to the phase offset amount by the phase offset code OSCDA is imparted by the threshold value offset code OSCDB, so that a loop of the CDR circuit 10 is made in a state of appearing to be locked. Therefore, by changing the phase offset code OSCDA, it becomes possible to make the CDR circuit 10 lock at the offset phase and to sweep the detection phase of data.

Figure 3:
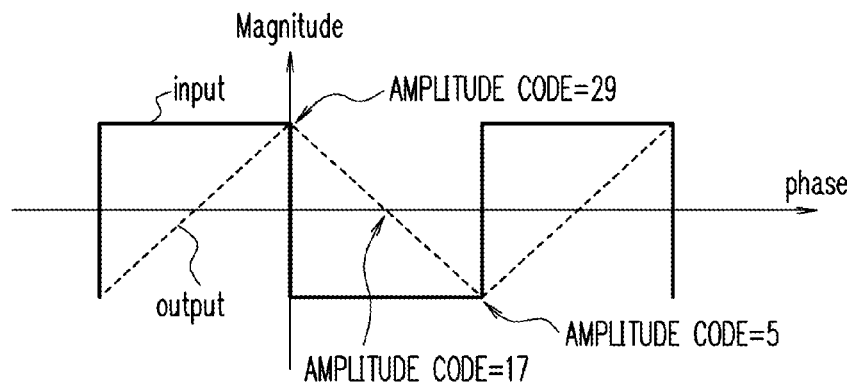
FIG. 3 is a diagram depicting a relation between a propagation signal and an integrated signal.

Here, a relation between the threshold value offset code OSCDB and the phase offset code OSCDA may be obtained from a relation between an interpolation code supplied to the data interpolation switched capacitor circuit 11 and an interpolated amplitude (voltage value). For example, in a case where a signal loss in a transmission line is small, a waveform of a signal "input" inputted to the data interpolation switched capacitor circuit 11 is close to that of a rectangular wave, a waveform of an integrated signal "output" becomes that of a triangular wave, as depicted in FIG. 3. In a case where the signal loss in the transmission line is small as above, a relation between amplitude and a phase becomes linear or almost linear, and thus a relation between the threshold value offset code OSCDB and the phase offset code OSCDA may be easily found. For example, when an amplitude code at a maximum value of an amplitude is "29" and an amplitude code at a minimum value of the amplitude is "5", an amplitude code at a differential zero cross point becomes "17". Therefore, the threshold value offset code OSCDB is obtained by changing a change amount corresponding to the phase offset code OSCDA from "17" being the amplitude code at the differential zero cross point.

Figure 4A:
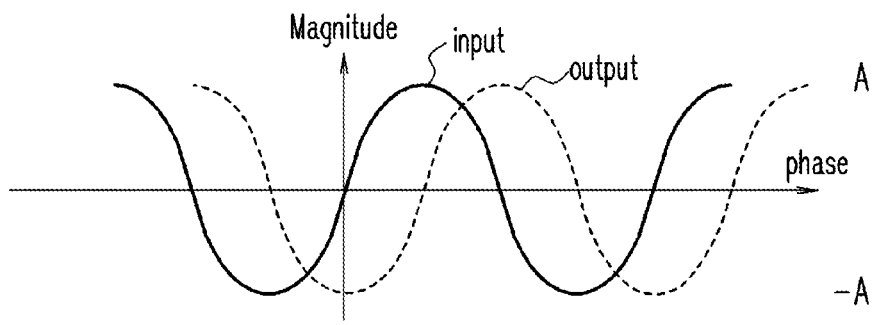
FIG. 4A is a diagram depicting a relation between a propagation signal and an integrated signal.
Figure 4B:
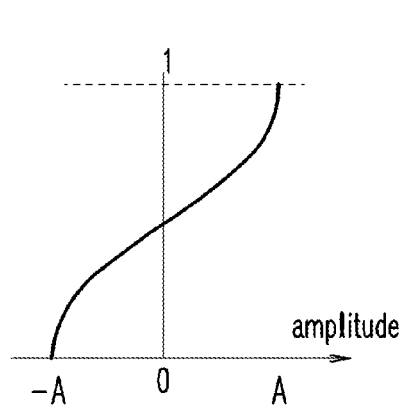
FIG. 4B is a diagram depicting an example of a cumulative distribution function of an amplitude.
Figure 4C:
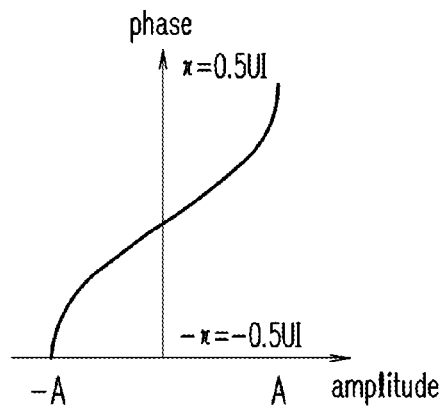
FIG. 4C is a diagram depicting a relation between an amplitude and a phase of a sine wave.

On the other hand, in a case where a signal loss in a transmission line is large, a waveform of a signal "input" inputted to the data interpolation switched capacitor circuit 11 is not that of a rectangular wave due to the loss, and becomes a waveform close to that of a sine wave, for example. Therefore, a waveform of an integrated signal "output" becomes that of a cosine wave. In a case where the signal loss in the transmission line is large as above, a relation between amplitude and a phase becomes non-linear. The relation between the amplitude and the phase may be found by using a cumulative distribution function of an amplitude depicted in FIG. 4B, for example. FIG. 4B depicts an amplitude cumulative distribution function of a sine wave as an example. By comparing FIG. 4A and FIG. 4B, it is possible to find a relation between an amplitude and a phase at a rising time of a sine wave as depicted in FIG. 4C.

First Embodiment

FIG. 5 is a diagram depicting a configuration example of a receiver circuit in a first embodiment. In FIG. 5, a component having the same function as a component depicted in FIG. 1 is given the same reference number or a reference symbol, and redundant explanation is omitted. The receiver circuit in the first embodiment includes a data-interpolation-type CDR circuit 10, a decision feedback equalizer (DFE) 20, and a first offset code generation circuit 41. The receiver circuit in the first embodiment includes, though not depicted in FIG. 5, a bit error rate detection circuit similarly to the receiver circuit depicted in FIG. 1.

The data-interpolation-type CDR circuit 10 includes a data interpolation switched capacitor circuit 11, a comparator 12, a demultiplexer 13, a phase detection circuit 15, a low-pass filter 16, an interpolation code generation circuit 17, and an adder 18, and in addition, a pattern filter 14. The pattern filter 14 is provided between the demultiplexer 13 and the phase detection circuit 15. The pattern filter 14 detects whether a signal is rising or falling based on data D0, B0, D1 outputted from the demultiplexer 13, and outputs a detection result to the phase detection circuit 15.

The phase detection circuit 15, referring to an output of the pattern filter 14, detects a boundary from a relation among three pieces of inputted data D0, B0, D1 at either one of rising and falling of the signal, decides whether to advance or delay the phase, and outputs a decision result. For example, as depicted in FIG. 2B, when a threshold value (decision point) in the comparator 12 is to be controlled, the phase detection circuit 15 decides whether to advance or delay the phase based on the three pieces of inputted data D0, B0, D1, at a time of falling of the signal. This is because, in a case where the threshold value (decision point) in the comparator 12 is to be controlled as depicted in FIG. 2B, a phase error of a boundary is detected and offset is lost if the phase detection circuit 15 performs decision also at a time of rising of the signal. In a case where the threshold value (decision point) for detecting a boundary in the comparator 12 is to be controlled so that a phase error of the boundary is not detected at rising, it suffices that the phase detection circuit 15 performs decision at the time of rising of the signal.

The decision feedback equalizer 20 is an equalization circuit deciding whether recovered data is "+1 (1)" or "−1 (0)" and feedbacking a decision result. The decision feedback equalizer 20 includes comparators 21, 24-1, 24-2, 24-3, 24-4, an equalizer logic circuit 22 which includes a level detection circuit 23, multiplexers 25-1, 25-2, 26, and delay circuits 27-1, 27-2.

The comparator 21 is a comparator for amplitude tracking in order for operating the equalizer logic circuit 22 well, and an output of the data interpolation switched capacitor circuit 11 is inputted thereto. The comparator 21 is provided also in a general decision feedback equalizer. For example, as a result that a threshold value is swept by using the comparator 21 thereby to detect a signal level by a level detection circuit 23, it is possible to obtain an amplitude cumulative distribution function of a signal which has been inputted and integrated. When the amplitude cumulative distribution function is obtained, a relation between amplitude and a phase is found, and thus it becomes possible to calculate a threshold value offset related to boundary decision in the comparator 12 from an amount of a phase offset (phase offset code OSCDA). The obtained amplitude cumulative distribution function is supplied to a first offset code generation circuit 41.

The equalizer logic circuit 22 generates and outputs control codes os1, os2, os3, os4 for controlling threshold values (decision points) in the comparators 24-1, 24-2, 24-3, 24-4 based on an output of the comparator 21. The comparators 24-1 to 24-4 compare an output of the data interpolation switched capacitor circuit 11 and a threshold value, to decide a magnitude relation. The multiplexers 25-1, 25-2, to which outputs of the comparators 24-1 to 24-4 are inputted, selects and outputs the outputs of the comparators 24-1 to 24-4 in correspondence with an output of the multiplexer 26. The outputs of the multiplexers 25-1, 25-2 are inputted to the multiplexer 26 via the delay circuits 27-1, 27-2 are outputted as recovered data. The delay circuits 27-1, 27-2 delay the inputs by time periods equivalent to one unit interval (UI) and output the delayed inputs. By the comparators 24-1 to 24-4, the multiplexers 25-1, 25-2, 26, and the delay circuits 27-1, 27-2, whether an output of the data interpolation switched capacitor circuit 11 is "+1 (1)" or "−1 (0)" is decided, and a decision result is outputted as recovered data.

The first offset code generation circuit 41 generates a threshold value offset code OSCDB corresponding to an inputted phase offset code OSCDA, based on the amplitude cumulative distribution function obtained by the decision feedback equalizer 20, and outputs to the comparator 12 in the CDR circuit 10. In other words, the first offset code generation circuit 41 generates and outputs a threshold value offset code OSCDB for imparting an offset corresponding to an amount of a phase offset to a threshold value (decision point) of boundary decision in the comparator 12. Note that generation of a threshold value offset code OSCDB by the first offset code generation circuit 41 may be calculated by using an amplitude cumulative distribution function, for example, or may be done by making and using a conversion table (conversion map) or the like based on the amplitude cumulative distribution function.

Figure 14A:
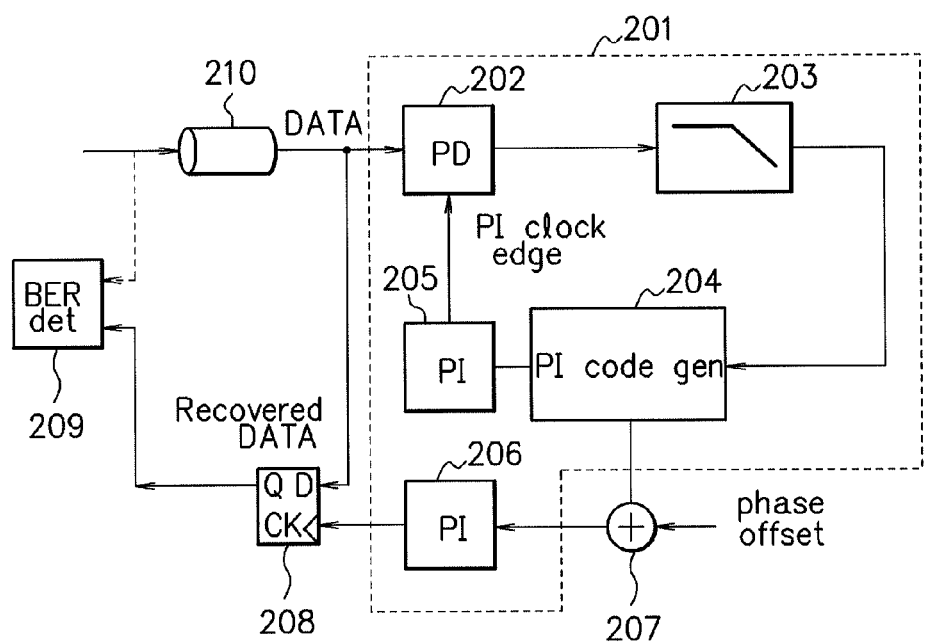
FIG. 14A is a diagram depicting a configuration example of a phase-interpolation-type CDR circuit having a function for a bath tub test or eye monitor.
Figure 14B:
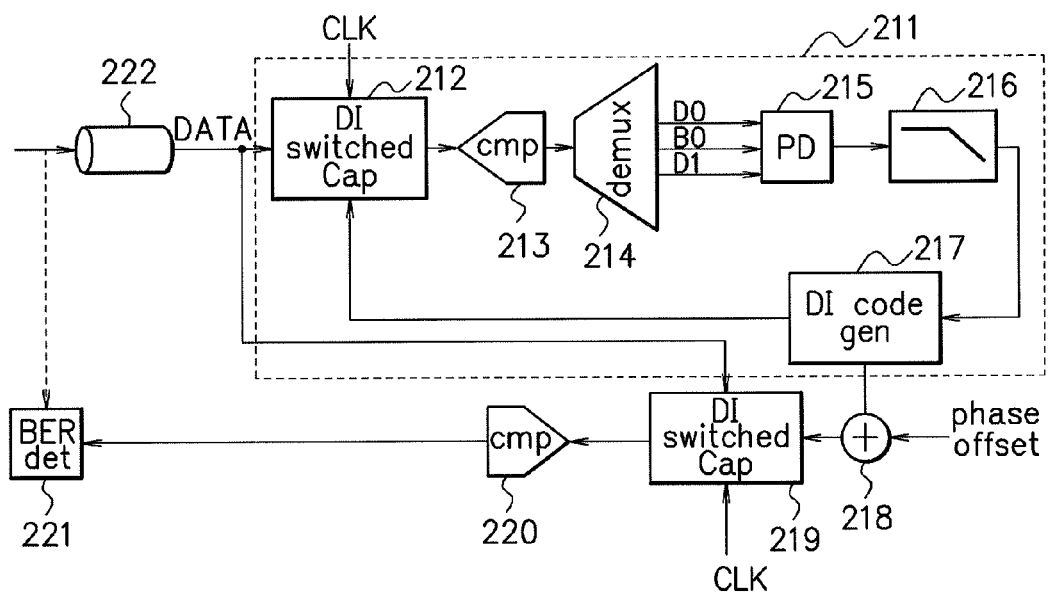
FIG. 14B is a diagram depicting a configuration example of a data-interpolation-type CDR circuit having a function for a bath tub test or eye monitor.

According to the first embodiment, an offset of a threshold value (decision point) in the comparator 12 may be properly controlled to a phase offset by a phase offset code OSCDA. Therefore, in a receiver circuit using the data-interpolation-type CDR circuit 10, it becomes possible to lock the CDR circuit 10 at an offset phase and to sweep a detection phase of data only by adding a few circuits, and a function of a bath tub test or eye-monitor may be realized. The decision feedback equalizer 20 is usually provided, and the comparator 21 being used in obtaining an amplitude cumulative distribution function in the decision feedback equalizer 20, is usually provided. Therefore, when compared with a case where a function for realizing a bath tub test or eye-monitor is not provided, the circuit area is hardly increased. Further, when compared with a configuration depicted in FIG. 14B, the number of the data interpolation switched capacitor circuits to be provided is half (one), and thus the circuit area is substantially curtailed and a load related to a clock signal is halved, so that power consumption is also curtailed.

In the receiver circuit in the first embodiment depicted in FIG. 5, an inverse function of an amplitude cumulative distribution function is used in order to find a threshold value offset to a phase offset from the amplitude cumulative distribution function obtained by the decision feedback equalizer 20. When a relation between the amplitude and the phase is linear or close to linear as depicted in FIG. 3, finding the threshold value offset to the phase offset is not difficult. On the other hand, when the relation between the amplitude and the phase is non-linear as depicted in FIG. 4A, there is a possibility that finding the threshold value offset to the phase offset is difficult.

Thus, as depicted in FIG. 6, it is possible to provide a second offset code generation circuit 42 instead of the first offset code generation circuit 41 so as to find a phase offset from a threshold value offset. FIG. 6 is a diagram depicting another configuration example of the receiver circuit in the first embodiment. In FIG. 6, components having the same functions as the components depicted in FIG. 1 and FIG. 5 are given the same reference numbers or reference symbols and redundant explanation is omitted.

The second offset code generation circuit 42 generates a phase offset code OSCDA corresponding to an inputted threshold value offset code OSCDB, based on an amplitude cumulative distribution function obtained by a decision feedback equalizer 20, and outputs to an adder 18 in a CDR circuit 10. In other words, the second offset code generation circuit 42 generates and outputs a phase offset code OSCDA for imparting a phase offset corresponding to an amount of an offset of a threshold value (decision point) in the comparator 12. Thereby, a phase offset may be directly calculated from an amplitude by using the amplitude cumulative distribution function without finding an inverse function of the amplitude cumulative distribution function obtained by the decision feedback equalizer 20.

Second Embodiment

Next, a second embodiment will be described. In the receiver circuit in the first embodiment, the comparator for the CDR circuit 10 is disposed in order that the comparator in the decision feedback equalizer 20 uses the different threshold value offset. Further, since only one threshold value offset may be set for one comparator, the CDR circuit may use only either one of a rising edge and a falling edge of a signal, so that the edge detection rate becomes half, reducing a gain of the CDR circuit and increasing tracking errors. A receiver circuit in the second embodiment realizes a phase offset of data detection by making the same comparator used by a CDR circuit 10 and a decision feedback equalizer 20, and solves the above problems.

An operation of a decision feedback equalizer will be described. FIG. 7 is a diagram for explaining an operation of a decision feedback equalizer of 1 tap. In view of an eye diagram of a signal, as depicted in FIG. 7A, in order to decide whether last bits of "011" and "010" are "0" or "1", for example, decision may be done more accurately by setting a first level LVA as a threshold level than by setting a center level in the eye diagram as the threshold level. Further, in order to decide whether last bits of "101" and "100" are "0" or "1", for example, decision may be done more accurately by setting a second level LVB as a threshold level than by setting a center level in an eye diagram as the threshold level.

In consideration of the above example, the decision feedback equalizer changes a threshold value for deciding a value of a next bit by using a previous result. Setting a threshold value for deciding a value of a next bit from a previous result is quite difficult in terms of timing, and there is a method called speculative DFE in which a comparator for each value is provided and decision is done in parallel and thereafter one correct result is chosen by using a previous result. In the example described above, a comparator in which a first level LVA is set as a threshold level and a comparator in which a second level LVB is set as a threshold level are prepared and decision is done, and the result is selected based on a previous result. That is, when the previous result is "1", the result of the comparator in which the first level LVA is set as the threshold level is selected, and when the previous result is "0", the result of the comparator in which the second level LVB is set as the threshold level is selected.

A method for realizing a phase offset of data detection in the present embodiment by using the one-bit speculative decision feedback equalizer is depicted in FIG. 7B. In this case, the same comparator may be used for the comparator of the CDR circuit 10 and for the comparator of the decision feedback equalizer 20, so that circuit area may be curtailed. Further, patterns to be detected are only "011" and "100". Since the decision feedback equalizer 20 used for the data-interpolation-type CDR circuit 10 includes the same number of comparators for data as comparators for boundary, the comparators for data offset DFE levels. Then, the comparators for boundary are used as the comparator exclusively for rising boundary and the comparator exclusively for falling boundary, respectively.

For example, in the CDR circuit 10, if it is desired that the boundary and the detection phase of data are offset in a left direction and locked, the threshold level of the comparator for falling boundary is set to be a third level LVC and the threshold level of the comparator for rising boundary is set to be a fourth level LVD. In contrast, in the CDR circuit 10, if the boundary and the detection phase of data are offset in a right direction and locked, the threshold level of the comparator for falling boundary is set to be the fourth level LVD and the threshold level of the comparator for rising boundary is set to be the third level LVC. By setting as above and selecting the result of the comparator in which the appropriate threshold level is set from the judgment result of previous bit, it is possible to cope with both the threshold value offset at a rising time and the threshold value offset at a falling time.

Figure 8:
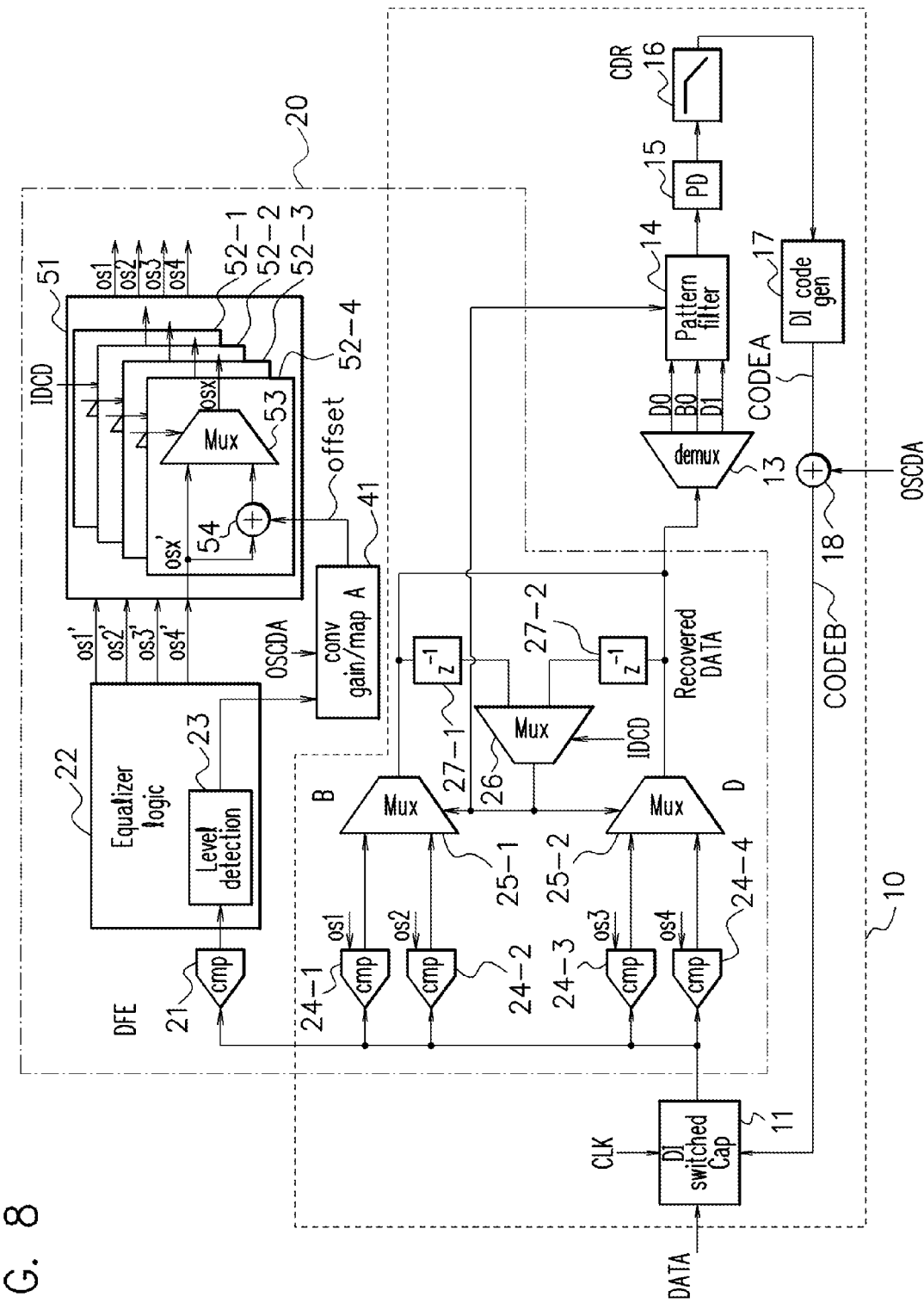
FIG. 8 is a diagram depicting a configuration example of a receiver circuit in a second embodiment.

FIG. 8 is a diagram depicting a configuration example of the receiver circuit in the second embodiment. The receiver circuit depicted in FIG. 8 offsets and locks a boundary and a detection phase of data in a CDR circuit 10 by using a speculative decision feedback equalizer. In FIG. 8, components having the same functions as the components depicted in FIG. 1 and FIG. 5 are given the same reference numbers or reference symbols and redundant explanation is omitted. In the receiver circuit in the second embodiment, comparators 24-1 to 24-4, multiplexers 25-1, 25-2, 26, and delay circuits 27-1, 27-2 are commonly used by the CDR circuit 10 and a decision feedback equalizer 20. Further, outputs of the multiplexers 25-1, 25-2 are supplied to a demultiplexer 13 in the CDR circuit 10. Note that the receiver circuit in the second embodiment includes, though not depicted in FIG. 8, a bit error rate detection circuit similarly to the receiver circuit depicted in FIG. 1.

A first offset code generation circuit 41 generates and outputs an offset code "offset" corresponding to an inputted phase offset code OSCDA, based on an amplitude cumulative distribution function obtained by the decision feedback equalizer 20. In other words, the first offset code generation circuit 41 generates and outputs the offset code "offset" for imparting an offset corresponding to an amount of a phase offset to a threshold value (decision point) of the comparator for boundary.

A processing circuit 51 in the decision feedback equalizer 20 includes internal circuits 52-1 to 52-4 corresponding to comparators 24-1 to 24-4. Each of the internal circuits 52-1 to 52-4 includes a multiplexer 53 and an adder 54. To the multiplexer 53 are inputted a control code osx' of the corresponding comparators 24-1 to 24-4, the control code osx' being outputted from an equalizer logic circuit 22, and a control code made by adding or deducting the offset code "offset" thereto/therefrom by the adder 54. The multiplexer 53 selects and outputs one of inputs as a control code osx, according to an identification code IDCD indicating which comparator among the comparators 24-1 to 24-4 is the comparator for boundary. The control code osx outputted from the multiplexer 53 is supplied as control codes os1 to os4 to the comparators 24-1 to 24-4 corresponding to the internal circuits 52-1 to 52-4.

For example, if the comparators 24-1, 24-2 are comparators for boundary, one of the internal circuits 52-1, 52-2 outputs what is made by adding the offset code "offset" to the control code osx' as the control code osx. The other of the internal circuits 52-1, 52-2 outputs what is made by deducting the offset code "offset" from the control code osx' as the control code osx. The internal circuits 52-3, 52-4 corresponding to the comparators for data output the control code osx' as the control code osx.

According to the second embodiment, an effect similar to that of the first embodiment may be obtained, and the circuit area may be curtailed since the comparators 24-1 to 24-4 or the like are commonly used by the CDR circuit 10 and the decision feedback equalizer 20 and the comparator used only for boundary detection by the CDR circuit is unnecessary.

Figure 9:
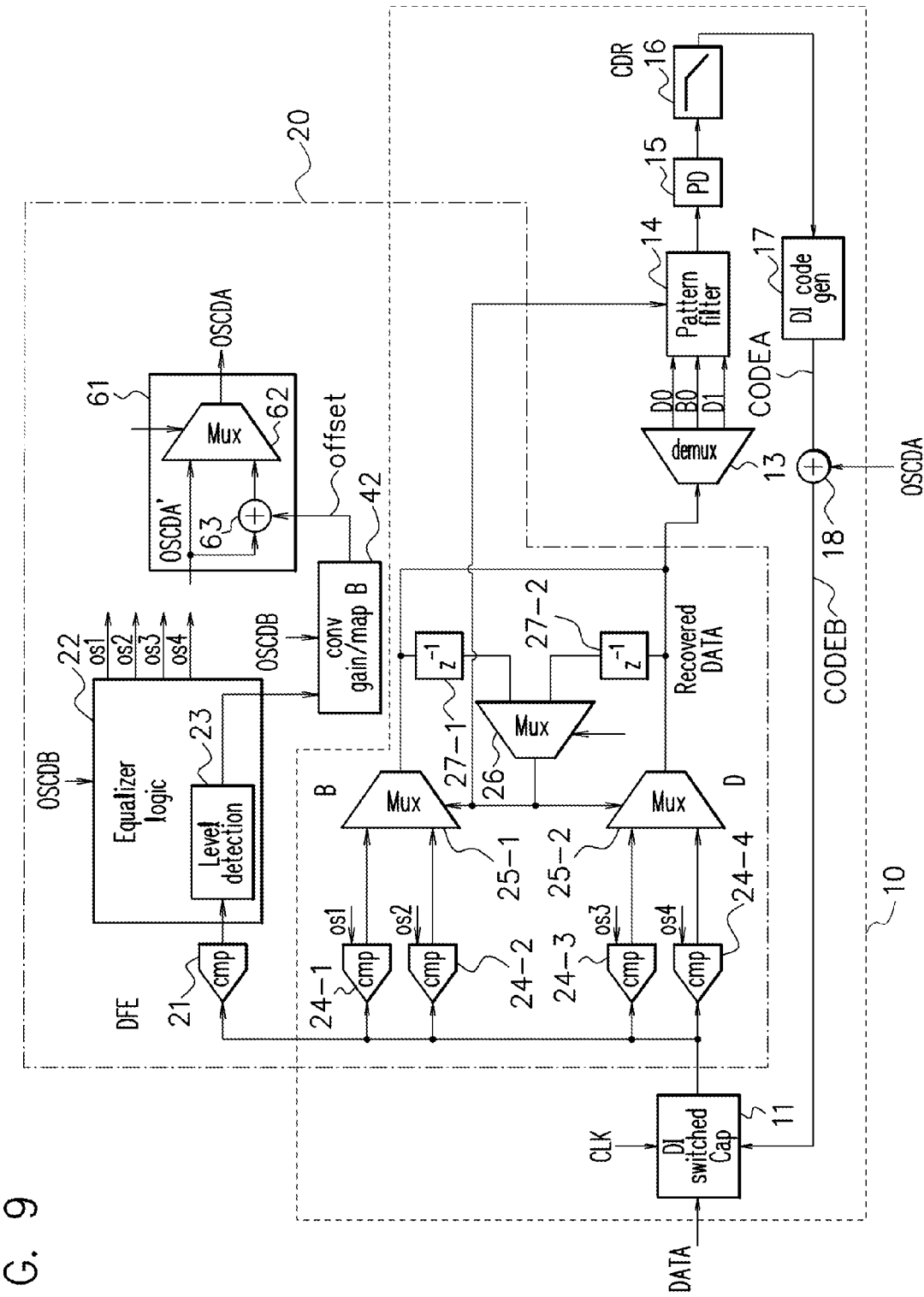
FIG. 9 is a diagram depicting another configuration example of the receiver circuit in the second embodiment.

In the second embodiment also, as depicted in FIG. 9, it is possible to provide a second offset code generation circuit 42 instead of the first offset code generation circuit 41, so as to find a phase offset from a threshold value offset. FIG. 9 is a diagram depicting another configuration example of the receiver circuit in the second embodiment. In FIG. 9, components having the same functions as the components depicted in FIG. 1, FIG. 5, and FIG. 8 are given the same reference numbers or reference symbols and redundant explanation is omitted.

In the receiver circuit depicted in FIG. 9, an equalizer logic circuit 22 in a decision feedback equalizer 20 generates and outputs control codes os1 to os4 for controlling threshold values (decision points) of comparators 24-1 to 24-4 based on an output of a comparator 21 and a threshold value offset code OSCDB. For example, if the comparators 24-1, 24-2 are comparators for boundary, the equalizer logic circuit 22 generates the control codes os1, os2 based on the output of the comparator 21 and the threshold value offset code OSCDB. Further, on this occasion, with regard to the comparators 24-3, 24-4 for data, the equalizer logic circuit 22 generates the control codes os3, os4 based on the output of the comparator 21.

The second offset code generation circuit 42 generates and outputs an offset code "offset" corresponding to the inputted threshold value offset code OSCDB, based on an amplitude cumulative distribution function obtained by the decision feedback equalizer 20. Thereby, an offset may be directly calculated from an amplitude by using the amplitude cumulative distribution function without finding an inverse function of the amplitude cumulative distribution function obtained by the decision feedback equalizer 20.

A processing circuit 61 in the decision feedback equalizer 20 includes a multiplexer 62 and an adder 63. To the multiplexer 62 are inputted a phase offset code OSCDA' and a phase offset code made by adding the offset code "offset" thereto by the adder 63. The multiplexer 62 selects one of inputs in correspondence with a selection signal and outputs as a phase offset code OSCDA to the adder 18. As a result of the above, it is possible to select whether or not to perform a phase offset to which an offset by the offset code "offset" is added, in correspondence with an operation state (test state or normal state) or the like, for example.

Though the case of the decision feedback equalizer of 1 tap is described in the aforementioned explanation, the cases are not limited thereto, and use of a decision feedback equalizer of a plurality of taps is also possible. When the decision feedback equalizer of the plural taps is used, it becomes possible to detect a greater number of data patterns for a boundary, and thereby a detection rate may be improved.

FIG. 10 is a diagram depicting an eye diagram of a decision feedback equalizer of 2 taps. Since the decision feedback equalizer of 2 taps uses four comparators for data and four comparators for boundary, respectively, a greater number of patterns may be detected. For example, in an example depicted in FIG. 10, patterns "110", "100" are detected as falling boundaries, and patterns "011", "001" are detected as rising boundaries.

For example, in the CDR circuit 10, when a boundary and a detection phase of data are desired to be offset in a left direction and locked, threshold levels of the comparators for falling boundary are set to be levels TLVA, TLVC, respectively, and threshold levels of the comparators for rising boundary are set to be levels TLVB, TLVD, respectively. In contrast, in the CDR circuit 10, when the boundary and the detection phase of data are desired to be offset in a right direction and locked, threshold levels of the comparators for falling boundary are set to be levels TLVB, TLVD, respectively, and threshold levels of the comparators for rising boundary are set to be levels TLVA, TLVC. As a result of above setting, by selecting a result of the comparator in which a proper threshold level is set from decision results of previous bits, it is possible to cope with both threshold value offset of a rising time and threshold value offset of a falling time.

FIG. 11 is a diagram depicting a configuration example of a receiver circuit in the second embodiment in a case where a multi-tap decision feedback equalizer 20 is used, and is the example of a form where a threshold value offset to a phase offset is found. In FIG. 11, components having the same functions as the components depicted in FIG. 1, FIG. 5, and FIG. 8 are given the same reference numbers or reference symbols and redundant explanation is omitted. In the multi-tap decision feedback equalizer 20, comparators 24-1 to 24-N (N=2×K) corresponding to the number of taps are provided. Either one of a group of the comparators 24-1 to 24-K and a group of comparators 24-(K+1) to 24-N is used as the comparators for boundary, and the other is used as the comparators for data. In correspondence with the comparators 24-1 to 24-N, control codes os1' to osN' and control codes os1 to osN are outputted, and internal circuits 52-1 to 52-N of a processing circuit 51 are provided. Basic configuration and operation of the receiver circuit depicted in FIG. 11 are similar to those in the receiver circuit depicted in FIG. 8.

Figure 12:
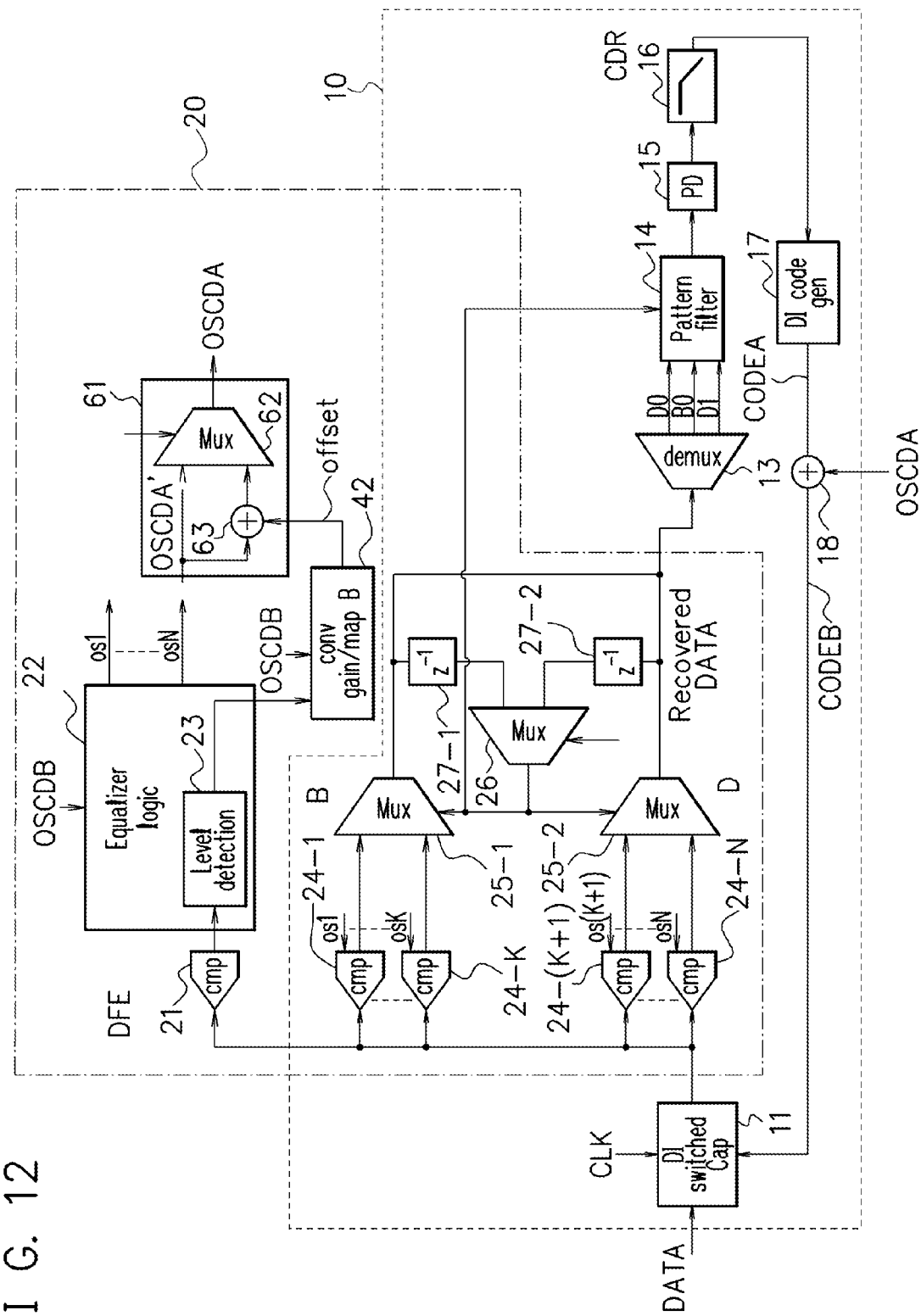
FIG. 12 is a diagram depicting another configuration example of the receiver circuit in the second embodiment.
Figure 13A:
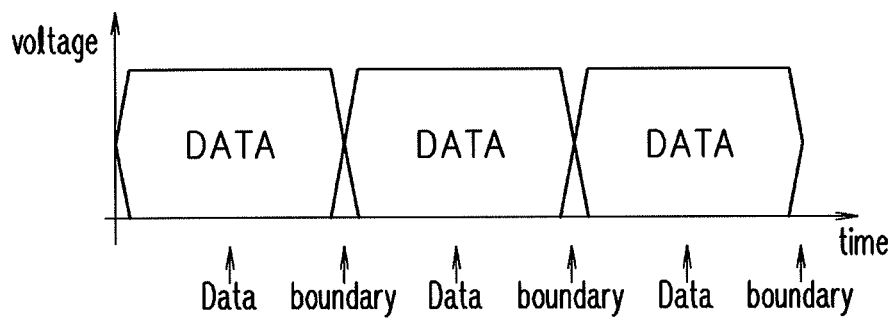
FIGS. 13A, 13B and 13C are diagrams depicting examples of a receive data waveform and an eye diagram.
Figure 13B:
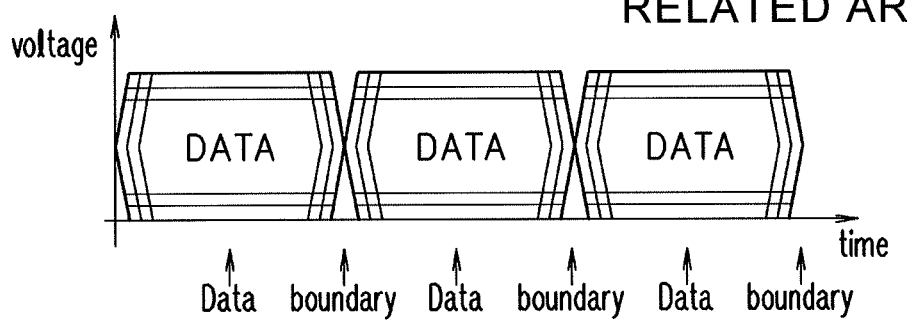
Figure 13C:
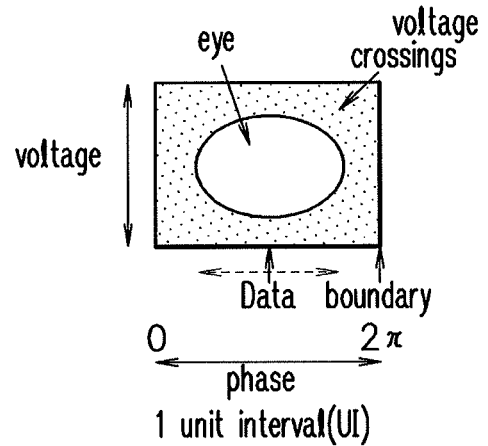

FIG. 12 is a diagram depicting another configuration example of the receiver circuit in the second embodiment in a case where a multi-tap decision feedback equalizer 20 is used, and is the example of a form where a phase offset to a threshold value offset is found. In FIG. 12, components having the same functions as the components depicted in FIG. 1, FIG. 5, FIG. 8, and FIG. 9 are given the same reference numbers or reference symbols. Basic configuration and operation of the receiver circuit depicted in FIG. 12 are similar to those in the receiver circuit depicted in FIG. 9 and explanation is omitted.

Note that in each embodiment described above, the data-interpolation switched capacitor circuit 11 outputs a voltage value interpolated from a sampled voltage value and the comparator 12 (24) performs comparison between the voltage value outputted from the data interpolation switched capacitor circuit 11 and the threshold value, but it not being limited to the voltage value, a current value may be used.

A disclosed receiver circuit enables locking of a CDR circuit at an offset phase by imparting an offset corresponding to an amount of a phase offset related to sampling of a data signal to a threshold value of a comparator, and it becomes possible to suppress increase of a circuit area and to measure a permissible amount of displacement of a detection phase of data.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A receiver circuit comprising:
   a sampling circuit which samples an inputted data signal by a clock signal and outputs a voltage value or a current value interpolated from a voltage value or a current value which have been sampled in correspondence with an inputted interpolation code indicating an interpolation ratio;
   a comparator which performs comparison between the voltage value or the current value output from the sampling circuit and a threshold value;
   a phase detection circuit which detects a transition point of the data signal based on the output of the comparator and decides whether to advance or delay a phase;
   an interpolation code generation circuit which generates an interpolation code corresponding to an output of the phase detection circuit; and
   an adder which adds a phase offset code indicating a phase offset amount related to sampling of the data signal to the interpolation code generated by the interpolation code generation circuit, and outputs the interpolation code to which the phase offset code is added to the sampling circuit,
   wherein an offset corresponding to the phase offset amount is imparted to the threshold value of the comparator.

2. The receiver circuit according to claim 1,
   wherein the threshold value of the transition comparator is offset to negate voltage change corresponding to the phase offset amount at a transition point of the data signal.

3. The receiver circuit according to claim 1, comprising:
   an offset code generation circuit which obtains a function indicating a relation between an amplitude and a phase of the data signal and generates a threshold value offset code indicating an offset amount of the threshold value of the first comparator from a phase offset amount indicated by the phase offset code based on the function.

4. The receiver circuit according to claim 1, comprising:
   an offset code generation circuit which obtains a function indicating a relation between an amplitude and a phase of the data signal and generates the phase offset code indicating a phase offset amount from an offset amount of the threshold value of the first comparator based on the function.

5. The receiver circuit according to claim 1, comprising:
   a decision feedback equalizer includes a comparator related to decision of the data sample and a comparator related to decision of a transition point of the data sample,
   wherein the decision feedback equalizer decides the data based on a voltage or a current outputted from the sampling circuit of the previous data, and
   wherein the comparator which performs comparison between the voltage value or the current value output from the sampling circuit and a threshold value, decides the transition point based on the previous data transition.

6. The receiver circuit according to claim 1, comprising:
   a pattern filter which detects whether the data signal is rising or falling based on the output of the comparator,
   wherein the phase detection circuit refers to an output of the pattern filter and performs decision at either one of rising and falling of the data signal.

7. The receiver circuit according to claim 5,
   wherein the decision feedback equalizer is a decision feedback equalizer of a plurality of taps.

8. A method for controlling a receiver circuit including: a sampling circuit which samples an inputted data signal by a clock signal and outputs a voltage value or a current value interpolated from a voltage value or a current value which have been sampled in correspondence with an inputted interpolation code indicating an interpolation ratio; a comparator which performs comparison between the voltage value or the current value output from the sampling circuit and a threshold value; a phase detection circuit which detects a transition point of the data signal based on an output of the comparator and decides whether to advance or delay a phase; and an interpolation code generation circuit which generates an interpolation code corresponding to an output of the phase detection circuit, the method comprising:
   imparting a phase offset related to sampling of the data signal; and
   imparting an offset corresponding to an amount of the phase offset to the threshold value of the comparator.

* * * * *